United States Patent

Koch et al.

Patent Number: 5,572,107
Date of Patent: Nov. 5, 1996

[54] SWITCHED CAPACITOR NETWORK

[75] Inventors: Rudolf Koch, Oberhaching; Michael Alger-Meunier, Haar, both of Germany

[73] Assignee: Siemens Aktiengesellschaft, Munich, Germany

[21] Appl. No.: 297,625

[22] Filed: Aug. 29, 1994

[30] Foreign Application Priority Data

Aug. 27, 1993 [DE] Germany .................. 43 28 973.8

[51] Int. Cl.⁶ .............. H02J 7/00; H03M 3/00; H03M 1/12
[52] U.S. Cl. .................. 320/1; 341/143; 341/172
[58] Field of Search ................. 320/1, 14, 56, 320/21, 19; 307/108–110; 341/143, 172; 363/59

[56] References Cited

U.S. PATENT DOCUMENTS

| | | | |
|---|---|---|---|
| 3,516,321 | 6/1970 | Harris | 320/1 X |
| 3,562,621 | 2/1971 | Schaefer | 320/1 |
| 3,940,678 | 2/1976 | Koyama | 320/1 |
| 4,422,155 | 12/1983 | Amir et al. | 364/606 |
| 4,965,711 | 10/1990 | Kamp et al. | 320/21 |
| 4,999,634 | 3/1991 | Brazdrum et al. | |
| 5,051,881 | 9/1991 | Herold | 320/1 |
| 5,057,839 | 10/1991 | Koch | |
| 5,387,882 | 2/1995 | Schoofs | 331/111 |

FOREIGN PATENT DOCUMENTS

| | | |
|---|---|---|
| 0396786 | 11/1990 | European Pat. Off. |
| 3401516 | 10/1986 | Germany |

*Primary Examiner*—Peter S. Wong
*Assistant Examiner*—K. Shin
*Attorney, Agent, or Firm*—Herbert L. Lerner; Laurence A. Greenberg

[57] ABSTRACT

A switched capacitor network includes a first capacitor being charged and discharged in alternation by a first switch device and being connected to a first voltage source for charging. A second capacitor is charged and discharged by the second switch device in synchronism with the first capacitor and is switched between the first voltage source and the second voltage source for charging. A product of the capacitance of the first capacitor and the voltage of the first voltage source is equal to a product of the capacitance of the second capacitor and a voltage difference between the two voltage sources. A product of the capacitance of the first capacitor and a contact resistance of the first switch device in a supply line path thereof, is equal to a product of the capacitance of the second capacitor and a sum of an internal resistance of the second voltage source and a contact resistance of the second switch device in a supply line path of the second capacitor.

3 Claims, 2 Drawing Sheets

SWITCHED CAPACITOR NETWORK

BACKGROUND OF THE INVENTION

1. Field of the Invention

The invention relates to a switched capacitor network having a capacitor being charged and discharged in alternation by a switch device and being connected to a voltage source for charging.

Active networks, to be realized, typically require an operational amplifier as an active component and capacitors and resistors as passive elements. The frequency dependency of the network is determined by the capacitors and resistors being used. Conversely, in switched capacitor networks, resistors are simulated by switched capacitors, and there is a linear relationship between the switching frequency and the equivalent electric conductance or guide value, corresponding to an ohmic resistor. The frequency dependency of the network can thus be varied in a simple way by varying the switch frequency.

As is described in the book entitled: Halbleiter-Schaltungstechnik [Semiconductor Circuitry], by U. Tietze and C. Schenk, 9th Edition, 1991, page 450 ff., the capacitors of a switched capacitor network are switched in such a way that they are each charged in a switching phase and discharged again in an ensuing switching phase. Instead of the discharge, a charge reversal can also ensue, which is equivalent to discharging with subsequent charging having opposite polarity. The onset of the charging or charge reversal process represents a major load for the charging voltage source, since the capacitor briefly forms a short circuit, and the current is primarily limited only by the internal resistance of the voltage source and the contact resistance of the switch device. The consequence is initially a voltage dip at the voltage source and subsequently a transient effect, which is determined essentially by the capacitance of the capacitor, the internal resistance of the voltage source, and the contact resistance of the switch device. That can cause inadequate charging of the respective capacitor in the corresponding switching phase, and resultant disruptions in the entire network.

SUMMARY OF THE INVENTION

It is accordingly an object of the invention to provide a switched capacitor network, which overcomes the hereinaforementioned disadvantages of the heretofore-known devices of this general type.

With the foregoing and other objects in view there is provided, in accordance with the invention, a switched capacitor network, comprising first and second voltage sources; first and second switch devices; a first capacitor being charged and discharged in alternation by the first switch device and being connected to the first voltage source for charging; a second capacitor being charged and discharged by the second switch device in synchronism with the first capacitor and being switched between the first voltage source and the second voltage source for charging; a product of the capacitance of the first capacitor and the voltage of the first voltage source being equal to a product of the capacitance of the second capacitor and a voltage difference between the two voltage sources; and a product of the capacitance of the first capacitor and a contact resistance of the first switch device in a supply line path thereof, being equal to a product of the capacitance of the second capacitor and a sum of an internal resistance of the second voltage source and a contact resistance of the second switch device in a supply line path of the second capacitor.

The voltage dip upon connection of the first capacitor by means of the first switch device and the ensuing transient effect are compensated for according to the invention by generating an opposite-polarity but otherwise identical voltage course with the aid of the second voltage source in combination with the second capacitor and the second switch device, which is superimposed on the course of the first voltage source.

Typically, the resistances (or impedances) occurring on the supply lines are negligible as compared with the internal resistance of the voltage sources and the contact resistance of the switch device. Therefore, in general, they have no influence on the function of the network either. Should that not be the case, however, then consequently adaptation of the resistances (impedances) of the supply lines and optionally further resistances (impedances) between the second voltage source and the second capacitor to corresponding resistances (impedances) between the first voltage source and the second capacitor is necessary. Moreover, if alternating voltage sources are used instead of direct voltage sources, care must be taken to ensure that their voltages are in phase with one another. Alternating voltage sources of this kind are realized, for instance, with two amplifiers of different gains, that are triggered by one signal source.

In accordance with another feature of the invention, both capacitors and the associated switch units are constructed differentially or in other words double. That is, two first capacitors of the same capacitance are accordingly provided, which are charged by the first switch device in alternation and in phase opposition with one another from the first voltage source, with the same polarities relative to a ground potential and are each subsequently discharged through a respective input circuit of a differential amplifier, and two second capacitors of the same capacitance, which are charged and discharged in alternation by means of the second switch device in synchronism with the first capacitors, and which are switched between the first voltage source and the second voltage source for charging.

In accordance with a concomitant feature of the invention, in order to suppress signal-dependent disturbances caused by loading of the signal path, there are provided two third capacitors of the same capacitance, which are charged by a third switch device from a signal voltage source in synchronism with the first capacitors with polarities being opposite one another relative to the ground potential, and subsequently are each discharged through a respective input circuit of the differential amplifier, and two fourth capacitors with the same capacitance as the first capacitors, the fourth capacitors being charged by the third switch unit in phase opposition with the respective corresponding first capacitor from the signal voltage source with the same polarities relative to the ground potential and each being subsequently discharged through a respective input circuit of the differential amplifier.

Other features which are considered as characteristic for the invention are set forth in the appended claims.

Although the invention is illustrated and described herein as embodied in a switched capacitor network, it is nevertheless not intended to be limited to the details shown, since various modifications and structural changes may be made therein without departing from the spirit of the invention and within the scope and range of equivalents of the claims.

The construction and method of operation of the invention, however, together with additional objects and advan-

DESCRIPTION OF THE PREFERRED EMBODIMENTS

Figure 1:
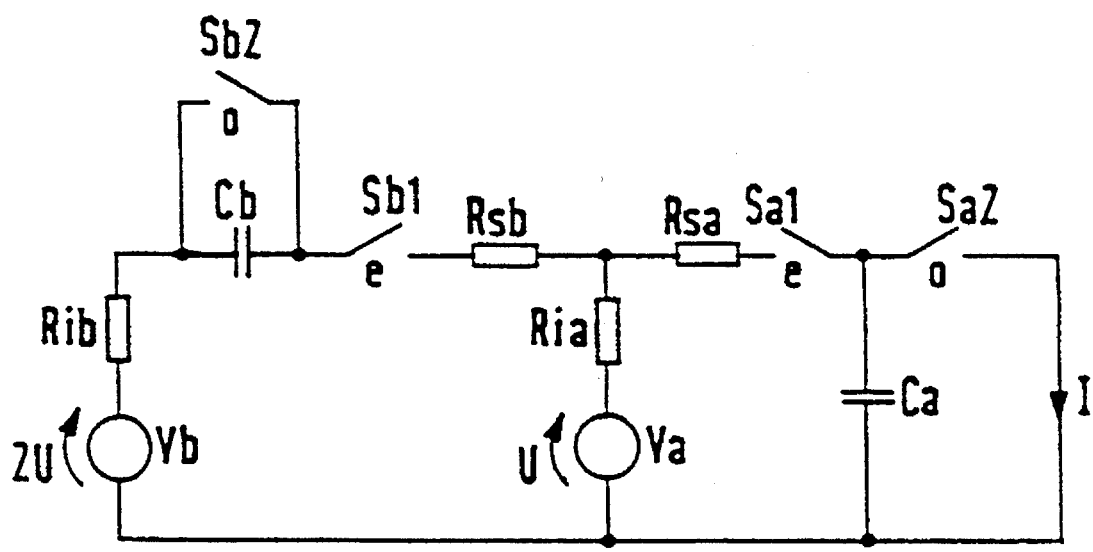
FIG. 1 is a schematic circuit diagram of a general exemplary embodiment of a network according to the invention.

Referring now to the figures of the drawing in detail and first, particularly, to FIG. 1 thereof, there is seen an exemplary embodiment having a capacitor Ca which is charged during a first switching phase by a voltage source Va having an internal resistance Ria and a voltage U. A controlled switch Sa1 that is switched between the voltage source Va and the capacitor Ca is closed, while a controlled switch Sa2 that is located parallel to the capacitor Ca is opened. In an ensuing second switching phase, the switch Sa1 is then opened and the switch Sa2 is closed, as a result of which the capacitor Ca is discharged. A mean discharging current I represents an output signal of this network. The switches Sa1 and Sa2 then continue to be opened and closed in alternation. In order to then compensate for voltage dips during the first switching phase and the ensuing transient effect, a further voltage source Vb with an internal resistance Rib and twice the voltage 2U in comparison with the voltage source Va, a further capacitor Cb and a controlled switch Sb1 in series therewith are provided and are switched between the two voltage sources Va and Vb. Finally, a switch Sb2 is connected parallel to the capacitor Cb. The switch Sa1 has a contact resistance Rsa, and the switch Sb1 has a contact resistance Rsb. The contact resistances of the switches Sa2 and Sb2 are adequate for complete discharging of the corresponding capacitors and have not been shown for the sake of simplicity. In order to trigger the switches Sa1, Sb1, Sa2 and Sb2, two clock signals e and o that are in opposite phase with one another and do not overlap are provided. The switches Sa1 and Sb1 are triggered with the clock signal e, and the switches Sa2 and Sb2 with the clock signal o. Instead of the switches Sa1, Sa2 and Sb1, Sb2, correspondingly triggered reversing switches could also be provided.

According to the invention, because of the voltage specifications, the two capacitors Ca and Cb are constructed with the same capacitance. Accordingly the sum of the internal resistance Rib and the contact resistance Rsb is equal to the contact resistance Rsa.

Figure 2:
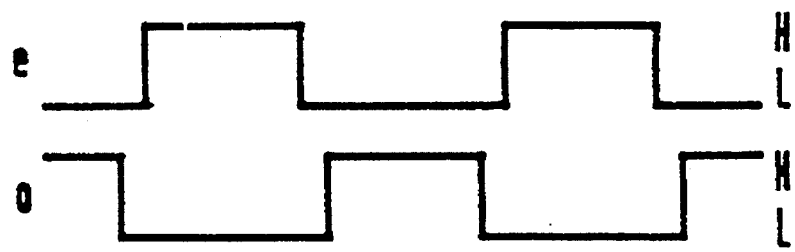
FIG. 2 is a diagram showing the course of switching phases in the network of FIG. 1.

The switching phases of the switches Sa1, Sa2, Sb1 and Sb2 are equivalent to H levels of the clock signals e and o. The timing relationship of the two phases is shown in FIG. 2 of the drawing. As this figure shows, the generation of signals of opposed phase takes place continuously. First, the clock signal e is at a high level H, and the clock signal o is at a low level L. After a signal change of the clock signal e and after a brief delay time, a signal change of the clock signal o from the low level L to the high level H takes place. After the signal transition from the level H to the level L of the clock signal o, a signal change from the level L to the level H takes place, after a brief delay, for the clock signal e. The clock signal e then carries the level H for a predetermined period of time, until a change again takes place, and so forth.

Figure 3:
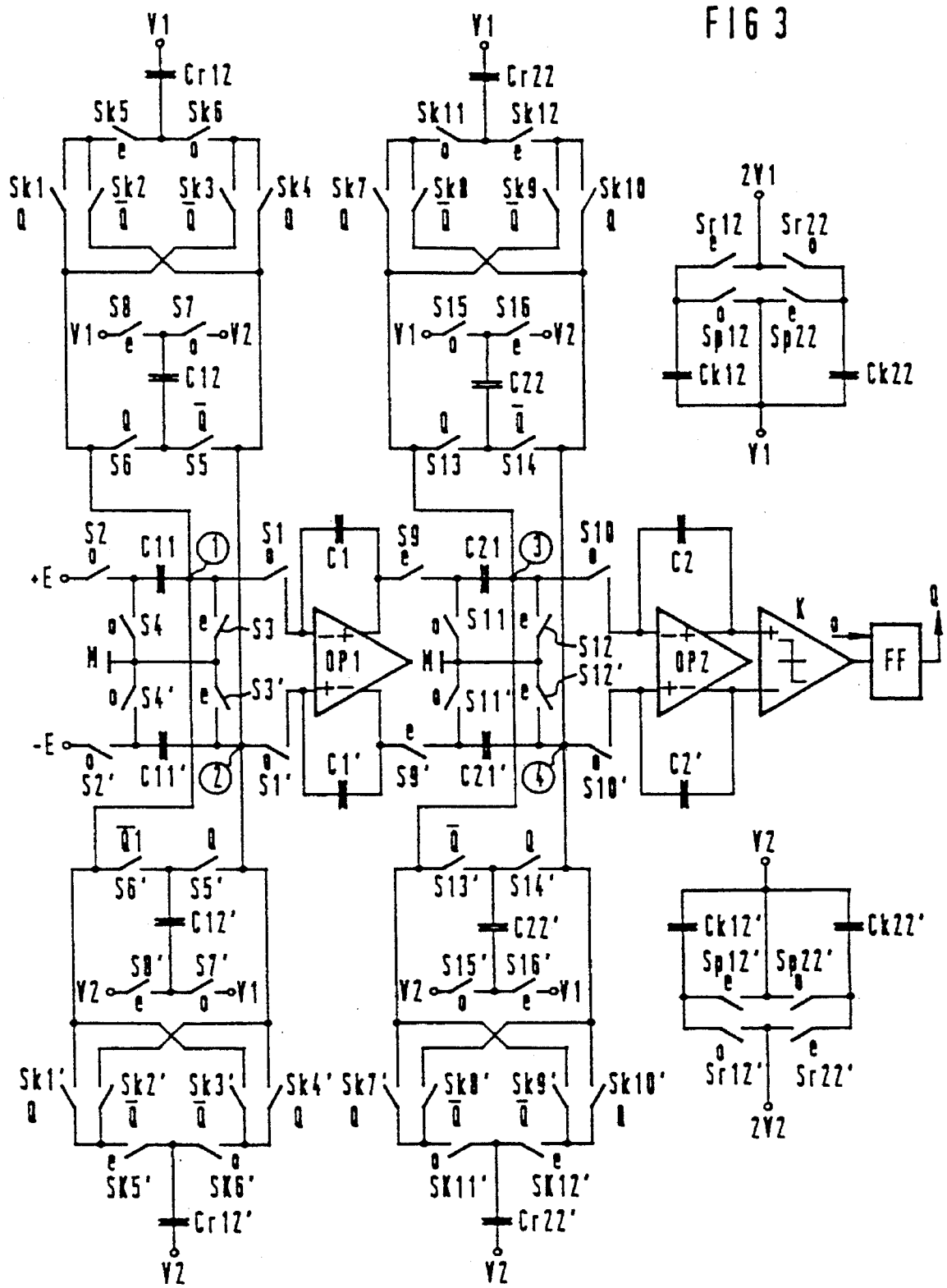
FIG. 3 is a schematic circuit diagram of an application of the invention in a known sigma-delta modulator.

An application of the invention to a switched-capacitor-type sigma-delta modulator, which is known from Published European Application No. 0 396 786 A1, corresponding to U.S. Pat. No. 4,999,634, will be discussed below. In FIG. 3, two operational amplifiers OP1 and OP2 are provided in the known sigma-delta modulator. In the case of the operational amplifier OP1, a capacitor C1 is connected between a non-inverting output and an inverting input, and a capacitor C1' is connected between an inverting output and a non-inverting input. The inverting input of the operational amplifier OP1 is also connected, through a switch S1, a capacitor C11 and a switch S2, to an input +E, and the non-inverting input of the operational amplifier OP1 is also connected, through a switch S1', a capacitor C11' and a switch S2', to an input −E. Moreover, a terminal of the capacitor C11 facing toward the input +E can be connected to a ground potential M through a switch S4, and a terminal of the capacitor C11 facing away from the input +E can be connected to the ground potential M through a switch S3. Correspondingly, a terminal of the capacitor C11' facing toward the input −E can be connected to a ground potential M through a switch S4', and a terminal of the capacitor C11' facing away from the input −E can be connected to the ground potential M through a switch S3'.

A node 1 formed by the capacitor C11, the switch S3 and the switch S1 is connected firstly through a switch S6 to one terminal of a capacitor C12 and secondly through a switch S6' to one terminal of a capacitor C12'. In the same way, a node 2 formed by the capacitor C11', the switch S3' and the switch S1' is connected firstly through a switch S5 to the one terminal of the capacitor C12 and secondly through a switch S5' to the one terminal of the capacitor C12'. The other terminal of each respective one of the capacitors C12 and C12' is connectable to a potential V1 through respective switches S8 and S7' and to a potential V2 through respective switches S7 and S8'.

In the case of the operational amplifier OP2, a capacitor C2 is connected between the non-inverting output and the inverting input, and a capacitor C2' is connected between the inverting output and the non-inverting input. The non-inverting output of the operational amplifier OP1 is connected through a switch S9, a capacitor C21 and a switch S10, to the inverting input of the operational amplifier OP2. In the same way, the inverting output of the operational amplifier OP1 is connected through a switch S9', a capacitor C21' and a switch S10', to the non-inverting input of the operational amplifier OP2. Moreover, terminals of the two capacitors C21 and C21' facing toward the operational amplifier OP1 can each be connected to the ground potential M through a respective switch S11 and S11' and the terminals of the two capacitors C21 and C21' facing toward the operational amplifier OP2 can each be connected to the ground potential M through a respective switch S12 and S12'.

One terminal of a capacitor C22 is connected through a switch S13, and one terminal of a capacitor C22' is connected through a switch S13' to a node 3 formed by the capacitor C21, the switch S12 and the switch S10. A node 4 formed by the capacitor C21' the switch S12' and the switch S10' is connected through a switch S14 to the one terminal of the capacitor C22 and through a switch S14' to the one terminal of the capacitor C22'. The other terminals of the capacitors C22 and C22' can be connected firstly through a respective switch S15 and S16' to the potential V1 and secondly through a respective switch S15' and S16 to a potential V2.

The non-inverting output of the operational amplifier OP2 is coupled to the non-inverting input of a comparator K, and the inverting output of the operational amplifier OP2 is connected to the inverting input of the comparator K. The output of the comparator K is carried to the input of a flip-flop FF, which is provided as a memory element. An output signal Q is present at the output of the flip-flop FF.

The switches S2, S2', S3, S3', S8, S8', S9, S9', S12, S12', S16, S16' and the comparator K are controlled with the clock signal e Correspondingly, the switches S1, S1', S4, S4', S7, S7', S11, S11', S10, S10', 515, S15' and the flip-flop FF are operated with the clock signal o. Finally, the switching cycles of the switches S6, S5', S13, S14' are defined by the output signal Q, and the switching cycles of the switches S5, S6', S13', S14 are defined by the inverted output signal $\overline{Q}$. The course of the clock signals e and o can again be found in FIG. 2.

In the sigma-delta modulator shown, the capacitors C11, C11', C21 and C21' are first charged from alternating voltage sources, namely by the symmetrical input signal +E and −E or by the symmetrical output signals of the operational amplifier OP1. Conversely, the capacitors C12, C12', C22 and C22' are charged by reference voltage sources, which generate the constant potentials V1 and V2. In this sigma-delta modulator, signal-correlated capacitive loads of the reference voltage sources, which differ in the various switching phases of the clock signals e and o, lead to undesired interference signals in the signal branch. For instance, during the switching phase of the clock signal e, the capacitor C12 is connected on one hand to the reference potential V1 and on the other hand to the integrator input, which forms the virtual ground potential. Therefore, the reference voltage source that generates the reference potential V1 is loaded, and the integrator with the operational amplifier OP1 and the capacitor C1 is interfered with. Conversely, in the switching phase of the clock signal o, the capacitor C12 is located between the reference potential V1 and the ground potential M and likewise loads the reference potential source that generates the potential V1, but without any effect on the signal +E supplied through the capacitor C11. Corresponding disturbances are brought about in the same way by the capacitors C12', C22 and C22'.

Loading of the signal sources that generate the signals +E and −E also occurs, but the resultant disturbances have no significant effects because of the symmetrical layout of the signal-carrying branch, so that a compensation according to the invention for the voltage dips can be omitted in this case.

In order to compensate for the disturbances caused by the dips in the potentials V1 and V2 in the signal-carrying branches, identically constructed capacitors CK12, CK12', CK22 and CK22' that correspond to the capacitors C12, C12', C22 and C22' are provided. One switch Sp12, Sp22' that is controlled by the clock signal o is connected parallel to each respective one of the capacitors Ck12 and Ck22' and one switch Sp12', Sp22 that is controlled by the clock signal e is likewise connected parallel to each respective one of the capacitors Ck12' and Ck22. These switches provide for periodic discharging of the associated capacitors. The capacitor Ck12 is connected on one side to the potential V1 and on the other side, with the interposition of a switch Sr12 controlled by the clock signal e, it is coupled to a potential 2V1. Correspondingly, the capacitor Ck12' is connected on one side to the potential V2 and on the other side it can be coupled to a potential 2V2 through a switch Sr12' controlled by the clock signal o. Accordingly, the capacitors Ck22 and Ck22' are each connected on side to a respective one of the potentials V1 and V2, and they each can be connected on the other side through a respective switch Sr22 and Sr22' that are respectively controlled by the clock signals o and e, to a respective one of the potentials 2V1 and 2V2. The potentials 2V1 and 2V2 each have twice the value of the respective potentials V1 and V2.

Finally, the voltage sources for generating the potentials 2V1 and 2V2 have a negligible internal resistance as compared to the contact resistance of the switches Sr12, Sr12', Sr22 and Sr22', so that for adaptation of the resistors in the various supply line paths, only these contact resistances have to be adapted. Since the identical capacitors C12, C12', C22 and C22' are connected to the respective potentials V1 and V2 by means of three identical switches on one hand, and to the ground potential M on the other hand, these switches Sr12, Sr12', Sr22 and Sr22' accordingly have three times the contact or transition resistance for that purpose, or are composed of three switches identical to them that are connected in series. The use of as many identical components as possible (switches, capacitors, etc.) is particularly valuable in an embodiment in integrated circuitry, since identical sizes can be achieved with substantially greater relative accuracy with respect to one another than different size relationships.

In order to compensate for the loading of the signal path by the capacitors C12, C12', C22 and C22', one additional capacitor-switch structure is also provided between the node 1 formed by the capacitor C11, the switch S1 and the switch S3, and the potential V1, and another additional capacitor-switch structure is provided between the node 2 formed by the capacitor C11', the switch S1' and the switch S3', and the potential V2. Beginning at the node 1, a switch Sk1 and a switch Sk3 each lead to a respective switch Sk5 and Sk6, which in turn are cennected on one hand to one another and on the other hand to one terminal of a capacitor Cr12. The i0 other terminal of the capacitor Cr12 is connected to the potential V1. The node 2 is coupled through switches Sk2 and Sk4 to the respective switches Sk5 and Sk6. The node 1 is also coupleable on one hand through a switch Sk1' to a switch Sk5' and on the other hand through a switch Sk3' to a switch Sk6' and the node 2 can be coupled on one hand through a switch Sk2' to the switch Sk5' and on the other hand through a switch Sk4' to the switch Sk6'. The switches Sk5' and Sk6' lead to one terminal of a capacitor Cr12', having another terminal to which the potential V2 is applied. The capacitors Cr12 and Cr12' correspond in their construction to the capacitors C12 and C12' respectively The switches Sk5 and Sk5' are controlled by the clock signal e, and the switches Sk6 and Sk6' are controlled by the clock signal o. The output signal Q is provided for controlling the switches Sk1, Sk1', Sk4 and Sk4', and the inverted output signal $\overline{Q}$ is provided for triggering the switches Sk2, Sk2', Sk3 and Sk3'.

Accordingly, such switch-capacitor structures are also switched between the node 3 which is formed by the capacitor C21, the switch S10 and the switch S12, and the potential V1, and also between the node 4 which is formed by the capacitor C21, the switch S10' and the switch S12', and the potential V2. Each of these structures has a respective capacitor Cr22 and Cr22', each having one terminal which is applied to a respective one of the potentials V1 and V2, and each having another terminal which is carried to two switches Sk11 and Sk12 on one hand, and Sk11' and Sk12' on the other hand. Each of the switches Sk11 and Sk11' can be coupled to the node 3 through a respective switch Sk7 and Sk7', and to the node 4 through a respective switch Sk8 and Sk8'. Finally, the switches Sk12 and Sk12' can each be connected to the node 3 through a respective switch Sk9 and Sk9', and to the node 4 through a respective switch Sk10 and Sk10'. The switches Sk7, Sk7', Sk10 and Sk10' are controlled by the output signal Q, and the switches Sk8, Sk8', Sk9 and Sk9', are controlled by the inverted output signal $\overline{Q}$. Finally, the switches Sk11 and Sk11' are triggered with the clock signal o, and the switches Sk12 and Sk12' are triggered with the clock signal e. As a consequence of the signal inversion by the integrator having the operational amplifier OP1 and the capacitors C1 and C1', the switches located closest to the capacitors, that is the switches Sk11, Sk12 on one hand and Sk11', Sk12' on the other hand, are triggered by the respectively other clock signal as compared with the corresponding switches Sk7, Sk8 on one hand and Sk7', Sk8' on the other hand The capacitors C12 and C22 are also constructed identically to the capacitors C12' and C22', respectively.

We claim:

1. A switched capacitor network, comprising:

first and second voltage sources;

first and second switch devices;

a first capacitor being charged and discharged in alternation by said first switch device and being connected to said first voltage source for charging;

a second capacitor being charged and discharged by said second switch device in synchronism with said first capacitor; said second capacitor being connected in series between said first voltage source and said second voltage source for charging;

a product of the capacitance of said first capacitor and the voltage of said first voltage source being equal to a product of the capacitance of said second capacitor and a voltage difference between said two voltage sources; and a product of the capacitance of said first capacitor and a contact resistance of said first switch device in a supply line path thereof, being equal to a product of the capacitance of said second capacitor and a sum of an internal resistance of said second voltage source and a contact resistance of said second switch device in a supply line path of said second capacitor.

2. The switched capacitor network according to claim 1, including:

differential amplifiers having input circuits;

another first capacitor, said two first capacitors having the same capacitance and being charged by said first switch device in alternation and in phase opposition with one another from said first voltage source with the same polarities relative to a ground potential, and each being subsequently discharged through said input circuit of a respective one of said differential amplifiers; and another second capacitor, said two second capacitors having the same capacitance and being charged and discharged in alternation by said second switch device in synchronism with said first capacitors, and being switched between said first voltage source and said second voltage source for charging.

3. The switched capacitor network according to claim 2, including:

a signal voltage source;

a third switch device;

two third capacitors having the same capacitance and being charged by said third switch device from said signal voltage source in synchronism with said first capacitors with polarities being opposite one another relative to the ground potential, and each being subsequently discharged through said input circuit of a respective one of said differential amplifiers; and two fourth capacitors having the same capacitance as said first capacitors, said fourth capacitors being charged by said third switch unit in phase with a respective corresponding one of said first capacitors from said signal voltage source with the same polarities relative to the ground potential, and each being subsequently discharged through said input circuit of a respective one of said differential amplifiers.

* * * * *